(12) United States Patent
Toyoda et al.

(10) Patent No.: US 6,550,339 B1
(45) Date of Patent: Apr. 22, 2003

(54) PRESSURE SENSOR FOR DETECTING DIFFERENTIAL PRESSURE BETWEEN TWO SPACES

(75) Inventors: Inao Toyoda, Okazaki (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/562,134

(22) Filed: May 1, 2000

(30) Foreign Application Priority Data

May 6, 1999 (JP) .......................................... 11-126145
Mar. 9, 2000 (JP) ....................................... 2000-071055

(51) Int. Cl.[7] .............................................. G01L 15/00
(52) U.S. Cl. ...................................................... 73/716
(58) Field of Search ................... 73/715–717, 725–727, 73/754, 706, 756, 724, 723

(56) References Cited

U.S. PATENT DOCUMENTS

| 4,131,088 | A | * | 12/1978 | Reddy ........................... 123/32 |
|---|---|---|---|---|
| 4,287,501 | A | * | 9/1981 | Tominaga et al. ............. 338/42 |
| 4,730,496 | A | * | 3/1988 | Knecht et al. ................. 73/724 |
| 4,771,639 | A | * | 9/1988 | Saigusa et al. ................ 73/727 |
| 5,166,082 | A | * | 11/1992 | Nakamura et al. ............ 437/31 |
| 5,437,189 | A | | 8/1995 | Brown et al. |
| 5,932,808 | A | * | 8/1999 | Hayashi et al. ................ 73/724 |
| 6,062,089 | A | * | 5/2000 | Ichihashi ...................... 73/754 |

* cited by examiner

Primary Examiner—Hezron Williams
Assistant Examiner—Marissa Ferguson
(74) Attorney, Agent, or Firm—Posz & Bethards, PLC

(57) ABSTRACT

A pressure sensor has two sensor elements respectively disposed in different pressure spaces A and B. Each of the sensor elements has a semiconductor substrate having a pressure reference chamber therein, a diaphragm formed as a wall defining the pressure reference chamber, and gauges for converting deformation of the diaphragm into an electric signal. The two sensor elements overlap with each other at sides opposite to the respective diaphragms, and close a hole formed in a partition member partitioning the two pressure spaces A and B. A differential pressure between the pressure spaces A and B is detected as a relative pressure by a difference between outputs from the two sensor elements.

17 Claims, 2 Drawing Sheets

| | SENSOR ELEMENT 10 | SENSOR ELEMENT 20 |
|---|---|---|
| 1 | DETEC. PORTION | DETEC. PORTION |
| 2 | DETEC. PORTION BIPOLAR ELEMENT | DETEC. PORTION |
| 3 | DETEC. PORTION MOS ELEMENT | DETEC. PORTION |
| 4 | DETEC. PORTION Bi-CMOS ELEMENT | DETEC. PORTION |
| 5 | DETEC. PORTION BIPOLAR ELEMENT | DETEC. PORTION MOS ELEMENT |

PRESSURE SENSOR FOR DETECTING DIFFERENTIAL PRESSURE BETWEEN TWO SPACES

CROSS REFERENCE TO RELATED APPLICATIONS

This application is based upon and claims the benefit of Japanese Patent Applications No. 11-126145 filed on May 6, 1999, and No. 2000-71055 filed on Mar. 9, 2000, the contents of which are incorporated herein by reference.

BACKGROUND OF THE INVENTION

1. Field of the Invention

This invention relates to a pressure sensor for detecting a differential pressure between two spaces as a relative pressure.

2. Description of the Related Art

JP-A-8-236788 discloses a pressure sensor for detecting a relative pressure. The pressure sensor has a substrate having a micro cavity therein and a hole formed from the back surface of the substrate to communicate with the micro cavity. In this constitution, however, it is necessary to use an alignment apparatus for determining the position of the micro cavity from the back surface of the substrate. In addition, when the hole is formed by anisotropic etching, dimensional variation of the etched hole is large. It is therefore difficult to miniaturize the cavity for performing positioning between the hole and the cavity.

To solve these problems, JP-A-5-52691 proposes a pressure sensor, which can detect a differential pressure by using two pressure sensitive elements to thereby determine a relative pressure. Specifically, two pressure sensitive diaphragm chips are provided on a glass base having two conduction pipes therein, and are air-tightly covered with a sealing case, thereby forming one pressure reference chamber.

In this pressure sensor, however, the sensor constitution is complicated as a whole. Further, it is necessary to perform steps for bonding the diaphragm chips to the glass base, and for forming the pressure reference chamber by the separate sealing case, in addition to steps for manufacturing the diaphragm chips from a wafer. This results in increased cost for manufacturing the pressure sensor.

SUMMARY OF THE INVENTION

The present invention has been made in view of the above problems. An object of the present invention is to provide a pressure sensor capable of detecting a relative pressure with a simple and low-cost structure.

According to the present invention, a pressure sensor has first and second sensor elements each having a semiconductor substrate having a pressure reference chamber, a diaphragm formed as a wall defining the pressure reference chamber, and a conversion member for converting deformation of the diaphragm into an electric signal. The first and second sensor elements are respectively disposed in first and second pressure spaces, which are separated from each other to have first and second pressures. A differential pressure between the first and second pressures is detected by a difference between outputs from the first and second sensor elements.

Because the pressure sensor of the present invention is composed of the two sensor elements each having the pressure reference chamber, the pressure sensor is simple in structure and manufactured readily at low cost.

Preferably, a signal processing element for constituting a signal processing circuit for processing the electric signal is provided in one of the first and second sensor elements. Accordingly, the pressure sensor can have a more simplified structure.

BRIEF DESCRIPTION OF THE DRAWINGS

Other objects and features of the present invention will become-more readily apparent from a better understanding of the preferred embodiments described below with reference to the following drawings, in which.

DETAILED DESCRIPTION OF THE PREFERRED EMBODIMENTS

First Embodiment

Figures 1, 2:
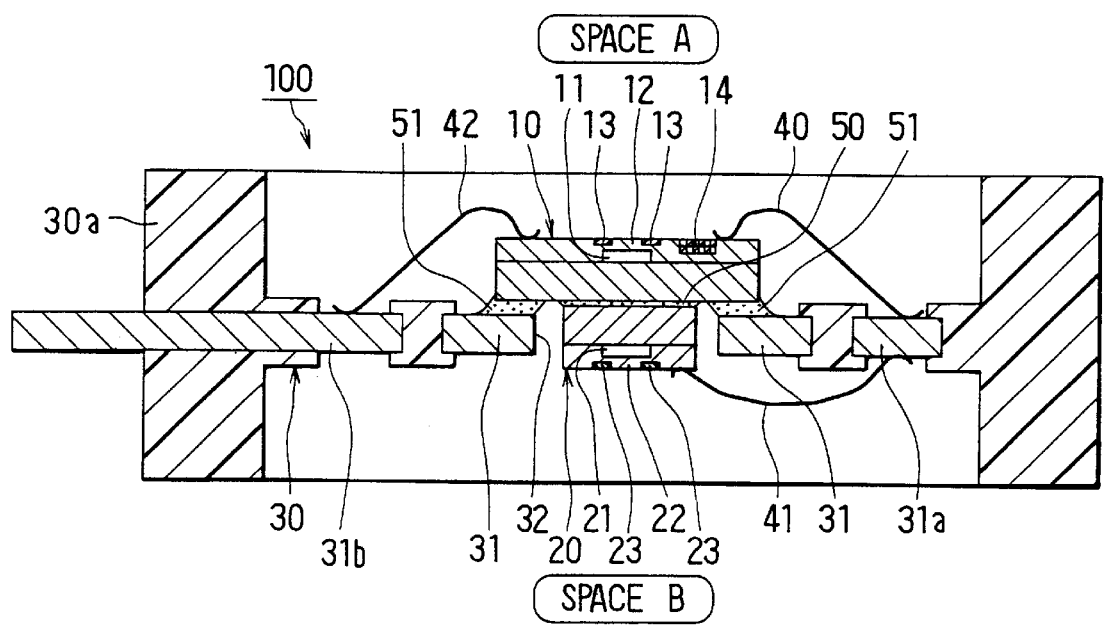
FIG. 1 is a cross-sectional view showing a pressure sensor in a first preferred embodiment of the present invention.
FIG. 2 is a table indicating examples of signal processing circuit elements formed in two sensor elements of the pressure sensor.

A pressure sensor 100 shown in FIG. 1 according to a first preferred embodiment is applicable to, for instance, a fuel pressure sensor for detecting a fuel pressure within a fuel tank of a vehicle. The pressure sensor 100 is composed of first and second sensor elements 10 and 20, which are laminated with one another. The first sensor element 10 detects an absolute pressure in a pressure space A (at a side of a reference pressure such as an atmospheric pressure), and the second sensor element 20 detects an absolute pressure in a pressure space B (at a side of a detection pressure such as a fuel tank side). The differential pressure between the two absolute pressures is detected as a relative pressure.

The first sensor element 10 disposed in the pressure space A is composed of a silicon-made semiconductor substrate defining therein a cavity as a pressure reference chamber 11. A thin diaphragm 12 is formed to serve as a wall defining the pressure reference chamber (cavity) 11 at a surface side of the chamber 11. Several gauges are formed on the diaphragm 12 as conversion members. The gauges 13 constitute a bridge circuit not shown, and convert deformation of the diaphragm 12 into electric signals. A signal processing circuit element 14 constituting a signal processing circuit is formed on one surface of the first sensor element 10. The signal processing circuit manipulates the electric signals from the bride circuit for amplification or adjustment.

The second sensor element 20 disposed in the pressure space B is composed of a silicon-made semiconductor substrate an area of which is smaller than that of the first sensor element 10. A cavity is formed inside the substrate as a pressure reference chamber 21. A thin diaphragm 22 is formed to serve as a wall of the pressure reference chamber 21 at a surface side of the chamber 21. Several gauges 23 having the same function as that of the gauges 13 are formed on the diaphragm 22. The second sensor element 20 has no signal processing circuit.

The pressure spaces A and B are partitioned by a resin substrate 30. The substrate 30 is made of resin such as epoxy, PPS (polyphenylen sulfide), or PBT (polybutylene phthalate), into which a lead frame (electrode) 31 made of 42 alloy or the like to is inserted by insert molding to receive outputs from the sensor elements 10, 20. The resin substrate 30 is integrally supported by a case 30a made of resin or the like at an outer peripheral portion thereof. The case 30a is, for instance, attached to a fuel tank or a pipe of the tank (measured device), a pressure of which is to be detected. The surfaces (back surfaces) of the sensor elements 10, 20 opposite to the diaphragms 12, 22 and having difference areas from each other are bonded together by adhesive 50.

The back surface of the first sensor element 10 having the substrate area larger than that of the second sensor element 20 has a peripheral portion where the second sensor element 20 is not bonded, and the first sensor element 10 is bonded by adhesive 51 to the lead frame 31 at the peripheral portion to close a hole 32 formed in the lead frame 31. The adhesives 50, 51 are made of material such as resin. The overlapping sensor elements 10, 20 function as a part of the resin substrate 30 for partitioning the pressure spaces A, B from each other.

Wires 40, 41 extending from pads (not shown) of the first and second sensor elements 10, 20 to the lead frame 31a at a right side in FIG. 1 electrically connect the first and second sensor elements therethrough. Signal lines of four terminals (power source, GND, output 1, and output 2) of the bridge circuits each formed by the gauges 13 and 23 are connected to the wires 40, 41. A wire 42 extending from a pad (not shown) of the first sensor element 10 is connected to the lead frame 31b at the left side in FIG. 1, and outputs signals from the sensor elements 10, 20. Specifically, the wire 42 is a line for a circuit power source, GND and output signals, a terminal for adjustment, and the like. The lead frame 31 is electrically connected to an external circuit such as a vehicular ECU (not shown).

In the pressure sensor 100 having the constitution described above, as described above, the first sensor element. 10 detects the pressure in the pressure space A as an absolute pressure, and the second sensor element 20 detects the pressure in the pressure space B as another absolute pressure. Then, the signal processing circuit including the signal processing circuit element 14 determines the differential pressure between the two absolute pressures as a relative pressure.

Next, a manufacturing method of the pressure sensor 100 will be explained below. It is sufficient for the second sensor element 20, which does not have the signal processing element, to form only a pressure detection portion. Specifically, the gauges are formed from a diffusion layer in a surface portion of a silicon substrate, and a substrate surface structure including electrodes made of an aluminum (Al) thin film, contact holes, a surface protective film, and the like is formed on the gauges. After that, the back surface of the silicon substrate is anisotropically etched by potassium hydroxide (KOH) etching solution, thereby forming a diaphragm. The silicon substrate is bonded to a glass substrate by anodic bonding, and is diced into individual chips.

To form the first sensor element 10 having the signal processing element 14, a pressure detection portion and the signal processing circuit element 14 are formed. Specifically, after the element and gauges are formed from a diffusion layer in a surface portion of a substrate, the diaphragm is formed by anisotropically etching the back surface of the substrate by KOH etching solution. The substrate is then bonded to a glass base by anodic bonding, and is diced into individual chips. Accordingly, the first and second sensor elements 10, 20 respectively having the reference pressure chambers 11, 21 therein are provided.

Each of the first and second sensor elements 10, 20 may be formed by bonding two silicon substrates together under vacuum to have the cavity in place of bonding the silicon substrate to the glass base. The anisotropic etching solution for forming the diaphragms is not limited to the KOH etching solution, but may be tetramethyl ammonium hydroxide (TMAH) or other etching solution. otherwise, the diaphragms may be formed by dry etching.

Then, the sensor elements 10, 20 are bonded together by the adhesive 50 at the back surfaces opposite to the diaphragms, respectively. The sensor elements 10, 20 bonded together is bonded by the adhesive 51, at the peripheral portion of the back surface of the sensor element 10, to the lead frame 31 of the resin substrate 30, which is supported by the case 30a. Successively, wire bonding is carried out to connect wires 40–42, thereby completing the pressure sensor 100.

Thus, since the pressure sensor 100 of the present embodiment has the two sensor elements 10, 20 respectively having the pressure reference chambers 11, 21, the structure of the sensor is simplified as a whole. Since the sensor elements 10, 20 can be formed by an ordinal semiconductor manufacture technique at a wafer level, the manufacturing cost is low. Accordingly, the pressure sensor 100 can be manufactured with a simplified structure at low cost to detect a relative pressure.

Since the sensor elements 10, 20 are laminated with each other, the size of the sensor 100 can be reduced as a whole. Since the back surfaces of the sensor elements 10, 20 are bonded together, the entire height (dimension in a substrate thickness direction) can be decreased, and thermal conductivity is improved. As a result, variations in sensor temperature characteristics are reduced.

In the pressure sensor 100 shown in FIG. 1, the signal processing element 14 is formed only in the first sensor element 10, and integrated with the sensor. However, various constitutions can be applicable for the signal processing element as shown in FIG. 2.

In example 1, the signal processing circuit is provided in a region (for instance, the resin substrate 30) other than the sensor elements 10, 20. Examples 2, 3, and 4 correspond to the pressure sensor 100 shown in FIG. 1, and a bipolar transistor element, a MOS transistor element, or Bi-CMOS transistor element constitutes the signal processing circuit as the signal processing circuit element 14.

In examples 2, 3, and 4, the signal processing circuit element for the second sensor element 20 is also formed in the first sensor element 10. Therefore, as described above, it is sufficient for the second sensor element 20 to form only the pressure detection portion composed of the pressure reference chamber 21, the diaphragm 22, and the gauges 23. Since it is not necessary that the formation step for the signal processing element is performed to the second sensor element 20, the wafer process is simplified.

The bipolar transistor element constitutes an amplifier circuit for amplifying the electric signal from the bridge circuit formed by the gauges 13. The MOS transistor element and the Bi-CMOS transistor element respectively constitute a correction circuit for correcting the electric signal from the bridge circuit.

Example 5 adopts a bipolar transistor element and a MOS transistor element together as signal processing elements for the sensor elements 10, 20. The bipolar transistor element is formed in the first sensor element 10 and the MOS transistor element is formed in the second sensor element 20. When the sensor has two different signal processing elements as in sample 5, the wafer manufacture process can be simplified by forming the two elements in the sensor elements 10, 20, separately, The variations on manufacture cause variations in sensor characteristics and temperature characteristics to the pressure sensor. To solve this problem, various correcting methods are conceivable. For instance, laser trimming is performed to the thin film metallic resistor or current is conducted to flow in a fuse composed of the thin film metallic resistor to cut the fuse. Correction data may be written by an EPROM.

The thin film metallic resistor can be used in place of the bipolar transistor element described above, and adjusts the amplification of the electric signal from the bridge circuit. The EPROM can correct the electric signal from the bridge circuit in combination with the MOS transistor element. The thin film metallic resistor and the EPROM can be formed as a part of the signal processing circuit element 14.

Second Embodiment

Figure 3:
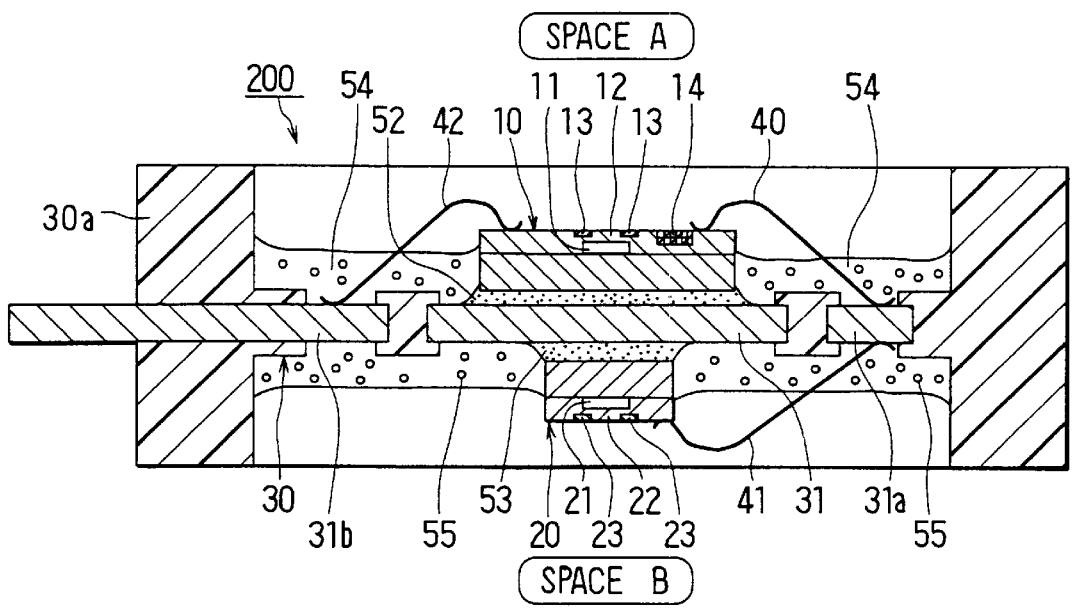
FIG. 3 is a cross-sectional view showing a pressure sensor in a second preferred embodiment of the present invention.

FIG. 3 shows a pressure sensor 200 in a second preferred embodiment of the present invention. In the second embodiment, the resin substrate 30 does not have the hole 32 as in the first embodiment. The sensor elements 10, 20 are respectively attached to both surfaces of the resin substrate 30 at the back surfaces not having the diaphragms 12, 22. The other features are substantially the same as those in the first embodiment. The same parts and components as those in the first embodiment are indicated by the same reference numerals, and the same explanation will not be reiterated.

As shown in FIG. 3, the back surface of the first sensor element 10 disposed in the pressure space A is bonded to one surface of the lead frame 31 through adhesive 52 made of, for instance, resin. The back surface of the second sensor element 20 disposed in the pressure space B is bonded to the other surface of the lead frame 31 through adhesive 53 made of, for instance, resin. Accordingly, the pressure sensor 200 can be provided at low cost to detect a relative pressure as in the first embodiment. Especially, in the second embodiment, since the pressure spaces A, B are separated from one another by the resin substrate 30, air-tightness is improved.

In the first and second embodiments, the sensor elements 10, 20 are bonded to the lead frame 31 of the resin substrate 30, however, may be bonded to the resin part of the substrate 30. When the sensor elements 10, 20 are bonded to the lead frame 31, preferably, the lead frame 31 is made of material having low thermal expansion coefficient such as 42 alloy. Accordingly, thermal strain becomes small, resulting in excellent temperature characteristics. The resin material of the resin substrate 30 is selected from epoxy, PPS, PBT, or the like as described above, but is not limited to those.

When the sensor elements 10, 20 are bonded to the resin parts of the resin substrate 30, the wires 40, 41, 42 extending from the sensor elements 10, 20 can be bonded to electrodes disposed on portions other than the resin parts, such as the upper portion of the sensor element 10 and the lower portion of the sensor element 20. Preferably, as shown in FIG. 3, protective members 54, 55 made of resin, rubber, gel, or the like are respectively disposed above the joining portions between the lead frame 31 and the resin substrate 30 after performing wire bonding. If there is a gap between the lead frame 31 and the resin substrate 30 partitioning the pressure spaces A, B, the gap forms a leakage path of pressure medium. The protective members 54, 55 are applicable to the first embodiment, and to a third embodiment described below.

Third Embodiment

Figure 4:
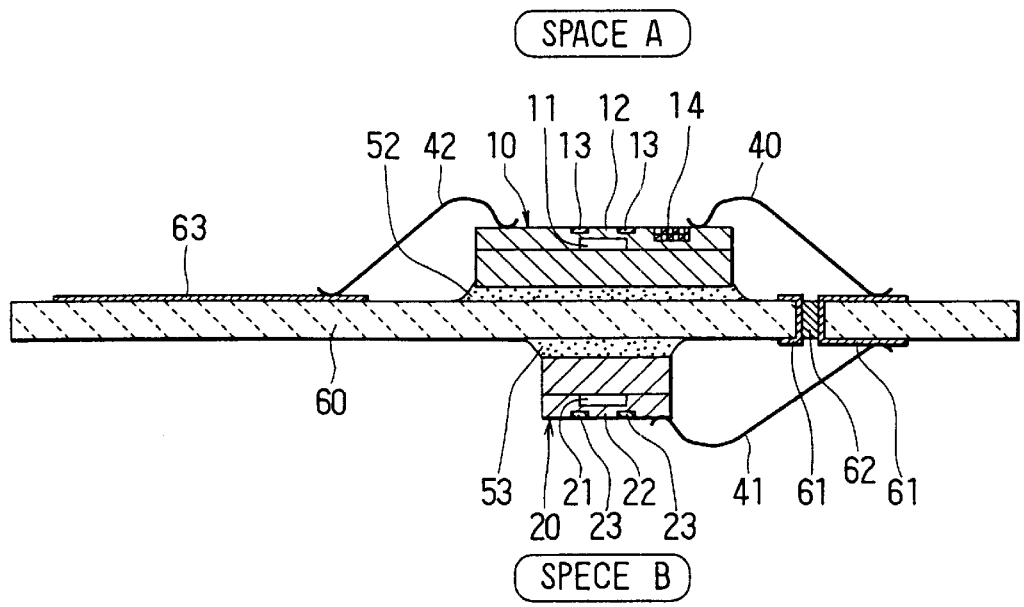
FIG. 4 is, a cross-sectional view showing a pressure sensor in a third preferred embodiment of the present invention.

The plate member for partitioning the pressure spaces A, B is not limited to the resin substrate 30 into which the lead frame 31 is insert-molded, but may by a ceramic substrate or the like. In this case, a through hole is formed in the ceramic substrate to allow electrical communication between electrical signals respectively taken out from two sensor elements via wires. FIG. 4 shows an example in which academic substrate 60 is utilized.

The ceramic substrate 60 has conductive thick films 61, which are formed on both surfaces of the substrate 60 and connected to each other via a wall surface of a through hold formed in the substrate 60. Reference numeral 62 denotes a conductive member (solder) filling the through hole 62. The conductive thick films 61 are made of copper or the like. Further, a conductive thick film 63 is formed on the surface of the ceramic substrate 60 at a side of the pressure space A to output the signal taken out through the wire 42. The members 61–63 form electrodes for receiving the signals from the sensor elements 10, 20 through the wires 40–42. The signals are taken out through the wires 40–42 and the members 61–63. The peripheral portion of the ceramic substrate 60 is supported by the case, which is not shown in FIG. 4, similarly to the resin substrate 30.

In the embodiments described above, the sensor elements 10, 20 are laminated with each other at the back surfaces thereof directly via the adhesive 50–53 or via the substrate 30 or 60 interposed therebetween. However, the sensor elements 10, 20 need not always face.each other-directly or via the substrate 30 or 60. For instance, the sensor elements 10, 20 may be respectively disposed on the surfaces of the substrate 30 or 60 to be shifted from each other in a substrate surface direction. Several sensor elements may be disposed in one pressure space. For instance, several sensor elements may be disposed in the pressure space B when one sensor element is disposed in the pressure sensor A and vice versa. Each of the pressure spaces A, B may hold several sensor elements therein. The present invention is not limited to the fuel pressure sensor, but may be other pressure sensors, which can detect a relative pressure between different pressure spaces.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A pressure sensor comprising:

a partition member;

first and second sensor elements, each comprising:
  a semiconductor substrate having a pressure reference chamber therein;
  a diaphragm formed as a wall defining the pressure reference chamber; and
  a conversion member for converting deformation of the diaphragm into an electric signal; and a signal processing element for processing the electric signal that is provided in one of the first and second sensor elements, wherein the signal processing element is a signal processing circuit;

wherein the first and second sensor elements are respectively disposed in first and second pressure spaces, which are different from each other and separated from each other by the partition member to respectively have first and second pressures;

wherein the partition member includes thereon a conductive member that electrically connects the first sensor element with the second sensor element;

wherein a differential pressure between the first and second pressures is detected as a relative pressure by a difference between outputs from the first and second sensor elements.

2. The pressure sensor according to claim 1, wherein only one of the first and second sensor elements has a thin film metallic resistor for adjusting amplification of the electric signal.

3. The pressure sensor according to claim 1, wherein only one of the first and second sensor elements has an EPROM for correcting the electric signal.

4. The pressure sensor according to claim 1, wherein the first and second sensor elements overlap with each other at surfaces respectively opposite to the diaphragm thereof.

5. The pressure sensor according to claim 1, wherein:
the partition member has a hole;
the first and second sensor elements overlap with each other; and
at least one of the two sensor elements is bonded to the partition member to close the hole.

6. The pressure sensor according to claim 5, wherein the first sensor element has a substrate area larger than a substrate area of the second sensor element and the first sensor element further has a first sensor main surface including the diaphragm and a first sensor back surface which is bonded to the partition to close the hole, and
wherein the second sensor element has a second sensor main surface including the diaphragm and a second sensor back surface which is bonded to the first sensor back surface through the hole.

7. A pressure sensor comprising:
a partition member;
first and second sensor elements, each comprising:
a semiconductor substrate having a pressure reference chamber therein;
a diaphragm formed as a wall defining the pressure reference chamber; and
a conversion member for converting deformation of the diaphragm into an electric signal; and
a signal processing element for processing the electric signal that is provided in one of the first and second sensor elements, wherein:
the signal processing element is a signal processing circuit;
the first and second sensor elements are respectively disposed in first and second pressure spaces, which are different from each other and separated from each other by the partition member to respectively have first and second pressures;
the partition member includes thereon a conductive member that electrically connects the first sensor element with the second sensor element;
a differential pressure between the first and second pressures is detected as a relative pressure by a difference between outputs from the first and second sensor elements; and
the signal processing element includes a first signal processing element provided in the first sensor element and a second signal processing element having a constitution different from the first signal processing element and provided in the second sensor element.

8. The pressure sensor according to claim 7, wherein:
the first signal processing element is a bipolar transistor element for amplifying the electric signal; and
the second signal processing element is a MOS transistor element for correcting the electric signal.

9. The pressure sensor according to claim 1, wherein:
the first sensor element is bonded to a first surface of the partition member; and
the second sensor element is bonded to a second surface of the partition member at a side opposite the first surface.

10. The pressure sensor according to claim 1, wherein the partition member is an insulation substrate and has another conductive member to output a signal from one of the sensor elements.

11. The pressure sensor according to claim 10, wherein the partition member is made of one of ceramic and resin.

12. The pressure sensor according to claim 11, wherein:
the partition member is made of resin; and
the another conductive member is insert-molded in the partition member.

13. A pressure sensor comprising:
a partition member;
first and second sensor elements, each comprising:
a semiconductor substrate having a pressure reference chamber therein;
a diaphragm formed as a wall defining the pressure reference chamber; and
a conversion member for converting deformation of the diaphragm into an electric signal; and
a signal processing element for processing the electric signal that is provided in one of the first and second sensor elements, wherein:
the signal processing element is a signal processing circuit;
the first and second sensor elements are respectively disposed in first and second pressure spaces, which are different from each other and separated from each other by the partition member to respectively have first and second pressures;
the partition member includes thereon a conductive member that electrically connects the first sensor element with the second sensor element;
a differential pressure between the first and second pressures is detected as a relative pressure by a difference between outputs from the first and second sensor elements;
the partition member is composed of resin and has another conductive member to output a signal from one of the sensor elements;
the another conductive member is insert-molded in the partition member; and
the pressure sensor further comprises a protective member covering a joining portion between the partition member and the another conductive member.

14. The pressure sensor according to claim 10, further comprising a wire connecting the another conductive member and one of the first and second sensor elements.

15. A pressure sensor for detecting a differential pressure between first and second spaces, the pressure sensor comprising:
a partition member partitioning first and second pressure spaces respectively having first and second pressures;
a first sensor element having a first sensor main surface which has a diaphragm exposed to the first pressure space to be deformed in response to the first pressure, and a first sensor back surface which is bonded to a first surface of the partition member with an area smaller than an area of the first surface of the partition member; and a second sensor element having a second sensor main surface which has a diaphragm exposed to the second pressure space to be deformed in response to the second pressure, wherein the partition member includes a conductive member that electrically connects the first sensor element with the second sensor element.

16. A pressure sensor comprising:

a partition member;

first and second sensor elements, each comprising:
- a semiconductor substrate having a pressure reference chamber therein;
- a diaphragm formed as a wall defining the pressure reference chamber, and
- a conversion member for converting deformation of the diaphragm into an electric signal; and a signal processing element for processing the electric signal that is provided in one of the first and second sensor elements, wherein:
- the signal processing element is a signal processing circuit;
- the first and second sensor elements are respectively disposed in first and second pressure spaces, which are different from each other and separated from each other by the partition member to respectively have first and second pressures;
- the partition member includes thereon a conductive member that electrically connects the first sensor element with the second sensor element;
- a differential pressure between the first and second pressures is detected as a relative pressure by a difference between outputs from the first and second sensor elements; and
- the signal processing element includes one of a bipolar transistor element, a MOS transistor element, and a Bi-CMOS transistor element and is provided only in the first sensor element.

17. A pressure sensor comprising:

a partition member;

first and second sensor elements, each comprising:
- a semiconductor substrate having a pressure reference chamber therein;
- a diaphragm formed as a wall defining the pressure reference chamber; and
- a conversion member for converting deformation of the diaphragm into an electric signal; and a signal processing element for processing the electric signal that is provided in one of the first and second sensor elements, wherein:
- the signal processing element is a signal processing circuit;
- the fist and second sensor elements are respectively disposed in first and second pressure spaces, which are different from each other and separated from each other by the partition member to respectively have first and second pressures;
- the partition member includes thereon a conductive member that electrically connects the first sensor element with the second sensor element;
- a differential pressure between the first and second pressures is detected as a relative pressure by a difference between outputs from the first and second sensor elements;
- the signal processing element includes a first signal processing element provided in the first sensor element and a second signal processing element provided in the second sensor element; and
- each signal processing element includes one of a bipolar transistor element, a MOS transistor element, and a Bi-CMOS transistor element such that each signal processing element includes a different type of transistor element from each other.

* * * * *